US006369596B1

United States Patent
Anderson

(10) Patent No.: US 6,369,596 B1
(45) Date of Patent: Apr. 9, 2002

(54) VACUUM-ASSISTED INTEGRATED CIRCUIT TEST SOCKET

(75) Inventor: David Loren Anderson, Kutztown, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/631,150

(22) Filed: Aug. 2, 2000

Related U.S. Application Data

(60) Provisional application No. 60/147,106, filed on Aug. 4, 1999.

(51) Int. Cl.$^7$ .................. G01R 31/02; G01R 31/073
(52) U.S. Cl. ........................... 324/755; 324/765
(58) Field of Search .................. 324/755, 754, 324/757, 758, 762, 761, 765; 269/21

(56) References Cited

U.S. PATENT DOCUMENTS 5,027,063 A * 6/1991 Letourneau .................. 324/754
5,410,791 A * 5/1995 Wirth et al. .................. 269/21
5,598,096 A * 1/1997 Pham et al. ............. 324/158.1

* cited by examiner

Primary Examiner—Ernest Karlsen
(74) Attorney, Agent, or Firm—Wendy W. Koba

(57) ABSTRACT

A vacuum-assisted arrangement for testing integrated circuits uses a first vacuum source to removably hold a test socket in place with respect to a test fixture. The socket further includes a plurality of alignment features to allow for the socket to be self-aligned with respect to the fixture. A second vacuum source is coupled through the combination of the fixture and the socket and is used to hold a device-under-test in place within the socket. The socket is formed to including a plurality of conductive elastomer contacts and the application of a consistent vacuum force allows for consistent testing of the integrated circuit devices.

15 Claims, 2 Drawing Sheets

VACUUM-ASSISTED INTEGRATED CIRCUIT TEST SOCKET

This application claims benefit to Provisional Application No. 60/147,106 filed Aug. 4, 1999.

BACKGROUND OF THE INVENTION

1. Field of the Invention

The present invention relates to a vacuum-assisted integrated circuit test socket and, more particularly, to an arrangement include a socket that is capable of being held against an associated test fixture by a first vacuum force with a second vacuum used to hold a device-under-test in position within the socket.

2. Description of the Prior Art

During the manufacture of integrated circuit devices, it is necessary to test the performance of packaged device. A typical test fixture comprises a spring-controlled socket, with the packaged device placed in the socket and the spring control used to "lock" the package in the socket during testing. Once the testing is completed, the spring is released and the device is removed. Advantageously, the same socket may be used time and again, providing a test fixture that may be used for large volumes of a particular integrated circuit package.

Although the use of a spring-controlled socket test fixture is useful for many packages, as integrated circuit speed increases (for example, 2.5 GHz and above), the parasitic inductance and capacitance associated with the conventional socket test fixture becomes intolerable. That is, the level of the parasitics begins to interfere with the test measurements. A prior art attempt at solving this problem is to use gold lead lines on the text fixture and form the test structure of a high dielectric material. While an improvement over the prior art, the best connections of the test package to this arrangement require soldering the package to the test structure. The soldering requirement thus slows down the testing process and is, in reality, not a solution for high volume testing applications.

Thus, a need remains in the art for a test fixture capable of testing devices operating at speeds of several GHz without exhibiting the high parasitic capacitance and inductance effects of the prior art arrangements.

SUMMARY OF THE INVENTION

The need remaining in the art is addressed by the present invention, which relates to a vacuum-assisted integrated circuit test socket and, more particularly, to an arrangement include a socket that is capable of being held against an associated test fixture by a first vacuum force with a second vacuum used to hold a device-under-test in position within the socket.

In accordance with the present invention, a test socket is formed to include a plurality of integral conductive elastomer contacts. The contacts may either be molded into the socket or inserted and held in place. The socket is formed to include alignment features in the form of protrusions from the bottom surface of the socket. The protrusions align with an underlying PCB test fixture to provide the necessary electrical alignment between the fixture and the socket. The bottom surface of the socket also includes a vacuum channel such that a vacuum force pulling down through the fixture will hold the socket against the fixture. A second vacuum port is included within the top surface of the socket and used to hold a device-under-test (DUT) in place against the socket.

It is an advantage of the present invention that the use of a vacuum force to hold the socket in place on the fixture eliminates the need for drill holes in the socket and metal alignment pins for attaching the socket to the fixture, where the prior art metal pins are a contributing factor to the parasitic problems discussed above. In the arrangement of the present invention, when the performance of a test socket degrades, the vacuum may be turned off and the socket quickly and easily replaced.

An additional advantage of the vacuum-controlled arrangement of the present invention is that the use of a vacuum force to hold a DUT within a test socket allows for the insertion force to be well-controlled (i.e., the vacuum force) such that each subsequently tested device is held in place with a relatively consistent force.

Other and further advantages of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
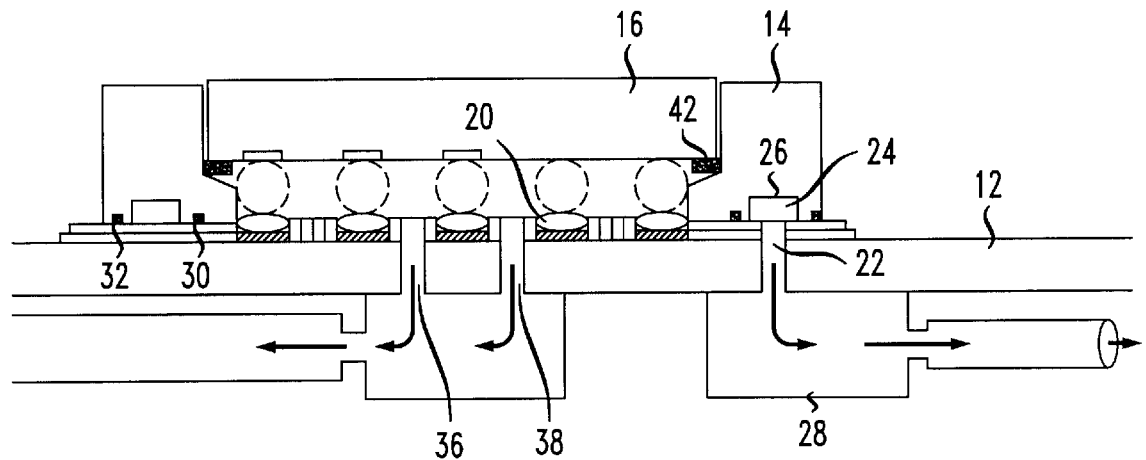
FIG. 1 contains a cut-away side view of an exemplary vacuum-assisted test arrangement formed in accordance with the present invention.

An exemplary vacuum-controlled test socket arrangement 10, formed in accordance with the present invention, is illustrated in FIG. 1. As shown, arrangement 10 comprises a printed circuit board (PCB) test fixture 12 and test socket 14. An exemplary device-under-test (DUT) 16 is also shown in place within test socket 14. PCB test fixture 12 includes a plurality of conductive test pads 18. Test socket 14 is preferably formed of a rigid polymer material and includes a plurality of conductive elastomer contacts 20. As shown in FIG. 1, conductive elastomer contacts 20 are disposed to come into physical contact with test pads 18 of PCB test fixture 12 upon mating of socket 14 with fixture 12. In accordance with the present invention, test socket 14 is removably attached to PCB fixture 12 by means of a vacuum force. Referring to FIG. 1, PCB fixture 12 is formed to include a first vacuum port 22 that engages with a vacuum channel 24 formed in the bottom surface 26 of test socket 14. Upon activation of a first external vacuum pump 28, a vacuum force will pull the periphery of test socket 14 into intimate contact with PCB fixture 12 such that conductive elastomer contacts 20 of test socket 14 will maintain the requirement physical (and therefore electrical) contact with test pads 18 of PCB fixture 12. A pair of socket seals 30 and 32 are disposed around the periphery of bottom surface 26 of test fixture 14, disposed on either side of vacuum channel 24. Seals 30 and 32 are used to maintain a sufficient vacuum force and prevent the unwanted separation of socket 14 from fixture 12.

An important aspect of the present invention is the inclusion of alignment features 34 in the bottom surface 26 of test socket 14 so that socket 14 will self-align with PCB fixture 12 upon mating. As will be discussed in detail below in association with FIGS. 3 and 4, alignment features 34 are formed at predetermined locations on bottom surface 26 and protrude therebelow. Alignment features 34 are sized to fit between test pads 18 of PCB fixture 12 and, as a result, provide the necessary alignment between PCB fixture 12 and test socket 14. The use of a self-aligned arrangement in accordance with the present invention thus eliminates the need for drill holes to be formed in the test socket and fixture, as well as the inclusion of metal locator pins in the drill holes to provide the alignment of the socket to the fixture. The elimination of the metal locator pins is particularly advantageous since the metal pins represent a significant contribution to the parasitic inductance and capacitance problems associated with prior art test arrangements. Additionally, the elimination of the drill holes allows for the overall size of the test socket to be reduced, the size reduction also resulting in further reducing parasitic effects in the test structure (as a result of the associated reduction of lead lengths in the test arrangement).

An exemplary DUT 16 is held within test socket 14, in accordance with the present invention, by the application of a second vacuum force. Referring to FIG. 1, a second vacuum port 36 and third vacuum port 38 are disposed through both PCB test fixture and test socket 14. Ports 36 and 38 are coupled to a second external vacuum pump 40 which, when activated will draw DUT 16 into the recessed opening 44 of test socket 14 with a force sufficient to provide the required electrical contact between bond pads 40 of DUT 16 and conductive elastomer contacts 20 of test socket 14. A vacuum seal 42 is disposed around the periphery of opening 44 of test socket 14 to maintain the requisite vacuum force between test socket 14 and DUT 16.

Figure 2:
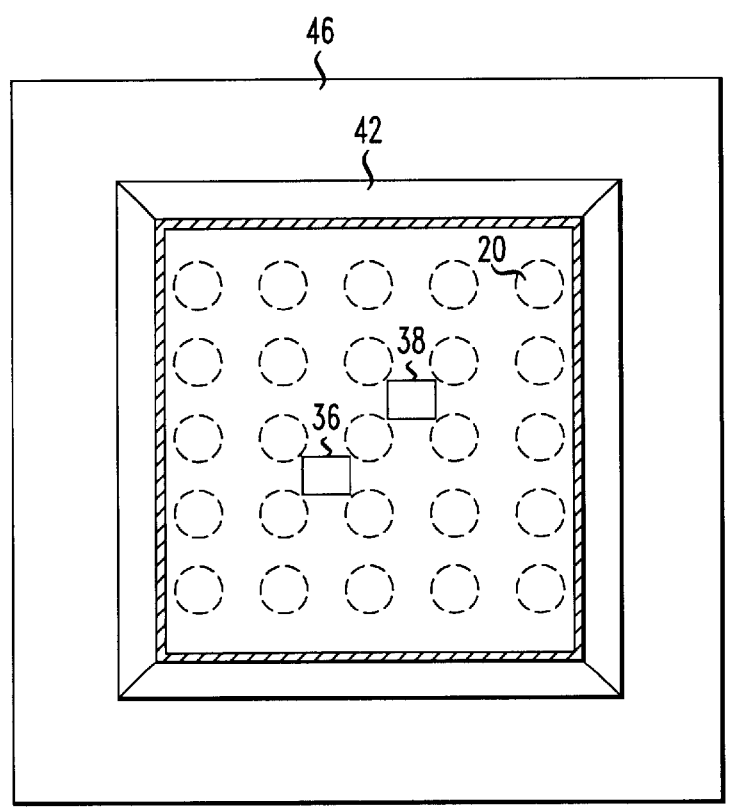
FIG. 2 is a top view of an exemplary vacuum-controlled test socket of the present invention.

A top view of an exemplary test socket 14 is illustrated in FIG. 2. Evident in this view are second and third vacuum ports 36 and 38, respectively, as well as vacuum seal 42. A plurality of conductive elastomer contacts 20 are shown as disposed within test socket 14, where these contacts will provide the electrical connection between PCB test pads 18 and DUT bond pads 40 (see FIG. 1). In accordance with the present invention, conductive elastomer contacts 20 may be either molded within test socket 14, or simply insertion fit within socket 14. An advantage of the vacuum-controlled arrangement of the present invention is that as socket 14 "wears out" (for example, as certain elastomer conductive contacts become dirty or otherwise non-conductive), the first vacuum force, as controlled by first vacuum pump 28 may be turned off, and the defective socket replaced.

Figure 3:
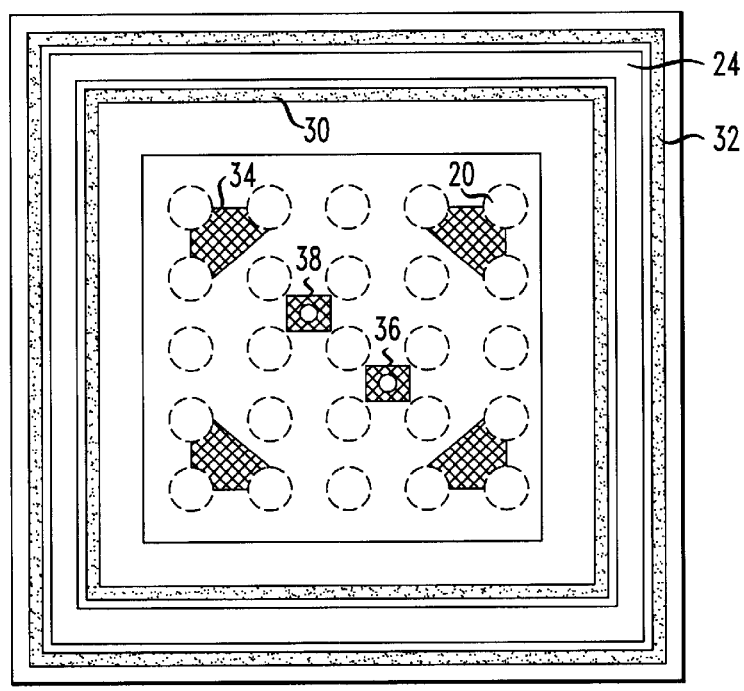
FIG. 3 is a bottom view of the test socket of FIG. 2, illustrating in particular an exemplary alignment feature arrangement.
Figure 4:
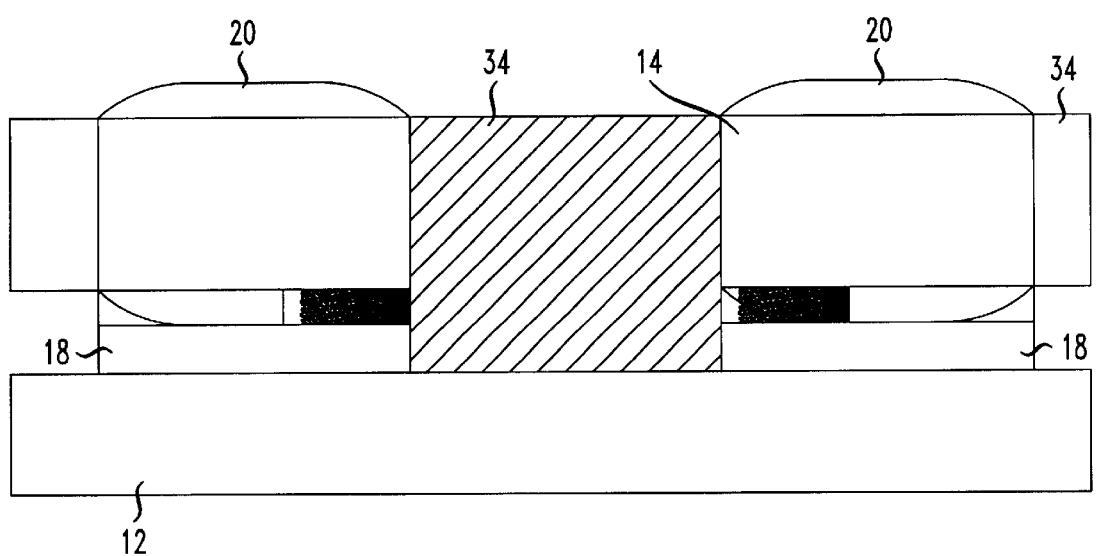
FIG. 4 is an enlargement of a portion of the arrangement of FIG. 1, showing the relative position of an exemplary alignment feature and the contact pads of a PCB test fixture.

FIG. 3 contains a bottom view of test socket 14, illustrating in particular a set of four alignment features 34 that are used to provide the self-alignment function between test socket 14 and PCB fixture 12. Features 34 are illustrated as disposed at the corners of socket 14 and are formed to be essentially wedge-shaped so as to fit between a set of three bond pads 18 of PCB fixture 12. FIG. 4 is an enlarged view of an exemplary feature 34 disposed between a pair of bond pads 18. Returning to FIG. 3, vacuum channel 24 and vacuum seals 26,28 are also shown. The entrances for vacuum ports 36,38 are disposed as shown in the central area of fixture 14 so as to provide for an essentially uniform force applied to DUT 16 when inserted in fixture 14. A feature of the present invention, as mentioned above, is that the vacuum force drawn by second pump 40 can be well-controlled so that each DUT 16 tested sequentially will be held against fixture 14 with an essentially identical force, resulting in an essentially identical electrical contact therebetween.

It is to be understood that there are many variations in the arrangement discussed above that are considered to fall within the spirit and scope of the present invention. For example, additional vacuum ports may be used, and various other vacuum port dispositions may be used, where all such arrangements are considered to fall within the spirit and scope of the present invention as defined by the claims appended hereto.

What is claimed is:

1. An arrangement for testing integrated circuit devices, said arrangement comprising a test fixture defined as comprising a top major surface and a bottom major surface and including a plurality of bond pad sites disposed in a predetermined pattern on said top major surface, said test fixture further comprising a first vacuum port disposed therethrough and at least a second vacuum port; and a test socket defined as including a recessed top portion and an opposing bottom surface, said test socket including a plurality of alignment features protruding beyond said bottom surface for mating with selected ones of said test fixture bond pad sites upon placement of said test socket upon said test fixture, said test socket further comprising a vacuum channel formed within said bottom surface and disposed to align with the first vacuum port of said test fixture such that upon application of a vacuum force said test socket will remain in physical contact with said text fixture, said test socket including at least one vacuum port aligned with said test fixture at least a second vacuum port such that upon insertion of an integrated circuit device in the recessed top portion of said test socket said integrated circuit device will be pulled into physical contact with said test socket by a vacuum applied thereto.

2. An arrangement as defined in claim 1 wherein the test socket further comprises a plurality of conductive elastomer contacts, said plurality of contacts for mating in a one-to-one relationship with said plurality of test fixture bond pad sites.

3. An arrangement as defined in claim 2 wherein the plurality of conductive elastomer contacts are molded within said test fixture.

4. An arrangement as defined in claim 2 wherein the plurality of conductive elastomer contacts are inserted within said test fixture.

5. An arrangement as defined in claim 1 wherein the test fixture comprises a printed circuit board.

6. An arrangement as defined in claim 1 wherein the test socket comprises a rigid polymer material.

7. An arrangement as defined in claim 1 wherein the test socket further comprises a pair of vacuum seals disposed on the bottom surface on opposing sides of the vacuum channel.

8. An arrangement as defined in claim 1 wherein the test socket further comprises a device vacuum seal disposed within the recessed top portion thereof.

9. An arrangement as defined in claim 1 wherein the plurality of fixture bond pads are disposed in a rectangular pattern and the plurality of test socket alignment features are formed as protrusions to engage with each corner of the rectangular pattern of test fixture bond pads.

10. An arrangement as defined in claim 1 wherein in the at least a second vacuum port comprises a pair of vacuum ports.

11. An arrangement as defined in claim 10 wherein the pair of vacuum ports are disposed in a central region of the test socket.

12. A method of testing an integrated circuit device, the method comprising the steps of:

a) providing a test fixture including a first vacuum port therethrough and at least a second vacuum port therethrough, said test fixture including a plurality of bond pad sites disposed on a top surface thereof;

b) providing a test socket including a recessed top portion and a plurality of alignment features formed in a bottom surface thereof for engaging and aligning with certain bond pad sites of the plurality of test fixture bond pad sites provided in step a), said test socket including a vacuum channel in the bottom surface thereof and further including at least one vacuum port aligned with the at least a second vacuum port of said test fixture;

c) engaging said test socket with said test fixture using the plurality of alignment features such that the first vacuum port is aligned with the test socket vacuum channel;

d) applying a first vacuum through said first vacuum port to hold said test socket in place with respect to said test fixture;

e) inserting a device to be tested into the recessed top portion of said test socket; and f) applying a second vacuum through said at least second vacuum port and said test socket to hold said device to be tested in place with respect to said test socket.

13. The method as defined in claim 12 wherein the method comprises the further steps of:

g) testing the inserted device; and h) upon completion of the testing, releasing the second vacuum and removing the tested device.

14. The method as defined in claim 12 wherein upon the failure of the test socket, the method comprises the further steps of:

g) releasing the first vacuum; and h) removing the failed test socket.

15. The method as defined in claim 12 wherein in performing step b), providing a test socket including a plurality of conductive elastomer contacts for aligning with the test fixture plurality of bond pad sites upon engagement.

* * * * *